US012588344B2

(12) United States Patent
Choi et al.

(10) Patent No.: US 12,588,344 B2
(45) Date of Patent: Mar. 24, 2026

(54) SEMICONDUCTOR LIGHT EMITTING DEVICE PACKAGE

(71) Applicant: SAMSUNG ELECTRONICS CO., LTD., Suwon-si (KR)

(72) Inventors: Seolyoung Choi, Yongin-si (KR); Sun Kim, Hwaseong-si (KR); Kyoungjun Kim, Yongin-si (KR); Junghun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 764 days.

(21) Appl. No.: 17/886,208

(22) Filed: Aug. 11, 2022

(65) Prior Publication Data

US 2023/0133634 A1 May 4, 2023

(30) Foreign Application Priority Data

Nov. 1, 2021 (KR) ......................... 10-2021-0147924

(51) Int. Cl.
| | |
|---|---|
| *H10H 20/858* | (2025.01) |
| *H10H 20/856* | (2025.01) |
| *H10H 20/857* | (2025.01) |

(52) U.S. Cl.
CPC ...... *H10H 20/8585* (2025.01); *H10H 20/856* (2025.01); *H10H 20/857* (2025.01)

(58) Field of Classification Search
CPC ............. H10H 20/8585; H10H 20/856; H10H 20/857; H10H 20/036; H10H 20/8506; H10H 20/825; H01L 25/0753; H01L 25/13
See application file for complete search history.

(56) References Cited

U.S. PATENT DOCUMENTS

| | | | |
|---|---|---|---|
| 6,372,608 B1 | 4/2002 | Shimoda et al. |
| 6,645,830 B2 | 11/2003 | Shimoda et al. |

(Continued)

FOREIGN PATENT DOCUMENTS

| | | | |
|---|---|---|---|
| JP | 2011-66169 A | 3/2011 |
| JP | 6128938 B2 | 5/2017 |

(Continued)

OTHER PUBLICATIONS

Office Action issued Sep. 1, 2025 by the Korean Intellectual Property Office in Korean Patent Application No. 10-2021-0147924.

*Primary Examiner* — William B Partridge
*Assistant Examiner* — Chevy J Boegel
(74) *Attorney, Agent, or Firm* — Sughrue Mion, PLLC

(57) ABSTRACT

A semiconductor light emitting device package includes: a ceramic substrate having first and second electrode structures; a light emitting diode chip mounted on the ceramic substrate, electrically connected to the first and second electrode structures, and configured to emit ultraviolet light; metal patterns disposed on the ceramic substrate to be spaced apart from the first and second electrode structures; an adhesive pattern disposed on the ceramic substrate between the adjacent metal patterns, the adhesive pattern having both side surfaces in contact with one side surface of the metal patterns and an upper surface positioned on a level below that of a lower surface of the light emitting diode chip; and a protector attached to the ceramic substrate by the adhesive pattern, the protector providing a cavity surrounding the light emitting diode chip.

17 Claims, 11 Drawing Sheets

(56)                 References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 8,896,078 B2 | 11/2014 | Kam et al. | |
| 9,653,644 B2 | 5/2017 | Han et al. | |
| 9,799,802 B2 | 10/2017 | Kim et al. | |
| 10,333,025 B1 | 6/2019 | Park et al. | |
| 10,483,433 B2 | 11/2019 | Park et al. | |
| 10,862,004 B2 | 12/2020 | Park et al. | |
| 2012/0267671 A1 | 10/2012 | Jung et al. | |
| 2015/0098249 A1* | 4/2015 | Song | G02B 6/0073 362/628 |
| 2020/0035884 A1 | 1/2020 | Iwai et al. | |
| 2021/0165280 A1* | 6/2021 | Lee | G02F 1/133603 |
| 2021/0210665 A1* | 7/2021 | Kim | H10H 20/8506 |
| 2021/0234335 A1* | 7/2021 | Kim | H01S 5/02257 |
| 2021/0257529 A1* | 8/2021 | Kim | H10H 20/856 |
| 2021/0296723 A1* | 9/2021 | Yamada | H01M 50/298 |

FOREIGN PATENT DOCUMENTS

| | | | |
|---|---|---|---|
| JP | 6539690 B2 | 7/2019 | |
| KR | 10-2017-0118401 A | 10/2017 | |
| KR | 10-2019-0070533 A | 6/2019 | |
| KR | 10-2019-0073908 A | 6/2019 | |
| KR | 10-2019-0073909 A | 6/2019 | |

* cited by examiner

I-I'

'A'

120

100A

SEMICONDUCTOR LIGHT EMITTING DEVICE PACKAGE

CROSS-REFERENCE TO RELATED APPLICATION

This application is based on and claims priority under 35 U.S.C. § 119 to Korean Patent Application No. 10-2021-0147924 filed on Nov. 1, 2021 in the Korean Intellectual Property Office, the disclosure of which is incorporated by reference herein in its entirety.

BACKGROUND

The disclosure relates to a semiconductor light emitting device package.

Semiconductor light emitting devices are known as next-generation light sources with advantages such as a longer lifespan, low power consumption, a fast response speed, environmental friendliness, and the like, as compared to conventional light sources, and are attracting attention not only as light sources for general lighting devices, display devices, and electric lamps, but also as various functional light sources for use in applications such as sterilization, growth promotion, and other biological applications.

Such a semiconductor light emitting device requires a reliable package structure for improving heat dissipation performance as well as light extraction efficiency.

SUMMARY

An aspect of the disclosure is to provide a semiconductor light emitting device package having excellent sealing properties and heat dissipation performance.

In accordance with an aspect of the disclosure, a semiconductor light emitting device package includes a ceramic substrate including a first electrode structure and a second electrode structure; a light emitting diode chip mounted on the ceramic substrate, wherein the light emitting diode chip is electrically connected to the first electrode structure and to the second electrode structure and is configured to emit ultraviolet light; a plurality of metal patterns disposed on the ceramic substrate spaced apart from the first electrode structure and from the second electrode structure; an adhesive pattern disposed on the ceramic substrate between adjacent metal patterns from among the plurality of metal patterns, wherein one side surface of the adhesive pattern contacts a side surface of one of the plurality of metal patterns, another side surface of the adhesive pattern contacts a side surface of another one of the plurality of metal patterns, and an upper surface of the adhesive pattern is positioned on a level below a level of a lower surface of the light emitting diode chip; and a protection layer attached to the ceramic substrate by the adhesive pattern, the protection layer providing a cavity surrounding the light emitting diode chip.

In accordance with an aspect of the disclosure, a semiconductor light emitting device package includes a circuit board including a ceramic body, a first electrode structure, and a second electrode structure, both of the first electrode structure and the second electrode structure penetrating the ceramic body; a light emitting diode chip mounted on the circuit board, wherein the light emitting diode chip is electrically connected to the first electrode structure and to the second electrode structure and is configured to emit ultraviolet light; a plurality of metal patterns disposed on the circuit board spaced apart from the first electrode structure and the second electrode structure; a first adhesive pattern disposed on the circuit board between adjacent metal patterns from among the plurality of metal patterns; a sidewall structure adhered to the circuit board by the first adhesive pattern, the sidewall structure providing a cavity surrounding the light emitting diode chip; and a cover disposed on the sidewall structure to seal the cavity, wherein the first adhesive pattern is surrounded by the plurality of metal patterns, the sidewall structure, and the ceramic body.

In accordance with an aspect of the disclosure, a semiconductor light emitting device package includes a circuit board; a light emitting diode chip mounted on an upper surface of the circuit board; a protection layer disposed on the upper surface of the circuit board, the protection layer providing a cavity surrounding the light emitting diode chip; and a dummy pattern and an adhesive pattern interposed between the upper surface of the circuit board and a lower surface of the protection layer.

BRIEF DESCRIPTION OF DRAWINGS

The above and other aspects, features, and advantages of certain embodiments of the disclosure will be more apparent from the following description taken in conjunction with the accompanying drawings, in which.

DETAILED DESCRIPTION

Hereinafter, example embodiments of the disclosure will be described with reference to the accompanying drawings.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to"

or "directly coupled to" another element or layer, there are no intervening elements or layers present. Like numerals refer to like elements throughout.

Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

For the sake of brevity, conventional elements to semiconductor devices may or may not be described in detail herein for brevity purposes.

Figure 1:
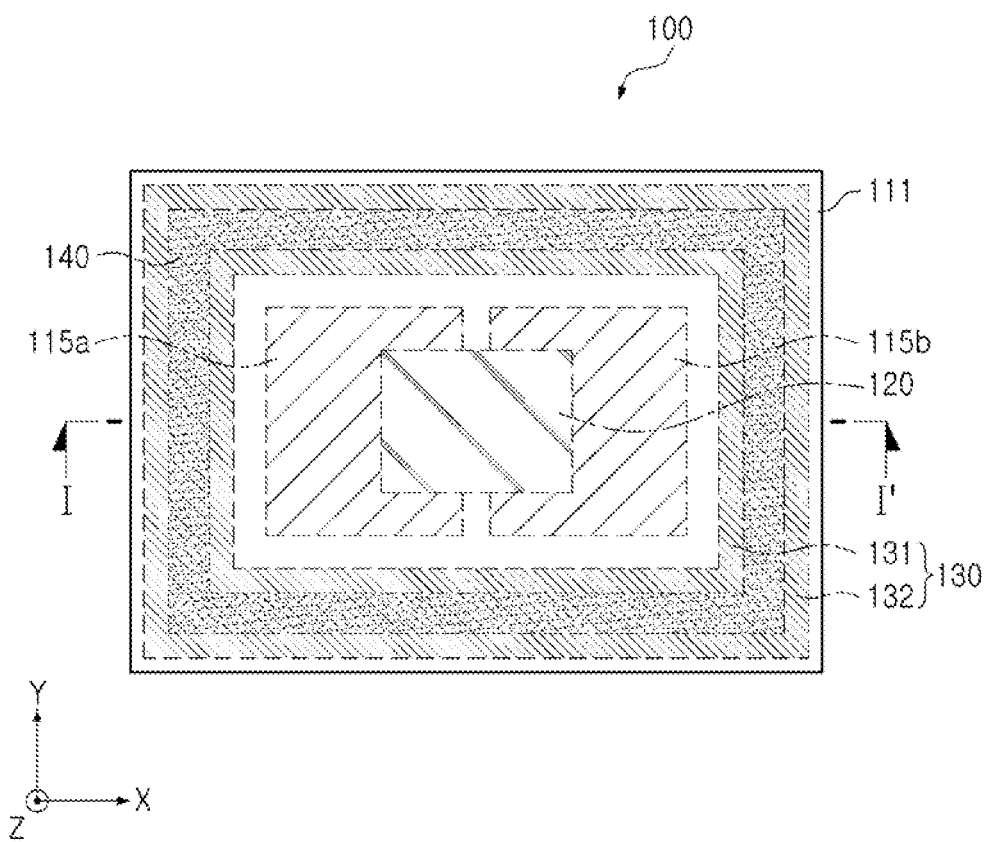
FIG. 1 is a plan view of a semiconductor light emitting device package according to an embodiment.

FIG. 1 is a plan view of a semiconductor light emitting device package according to an example embodiment.

Figure 2:
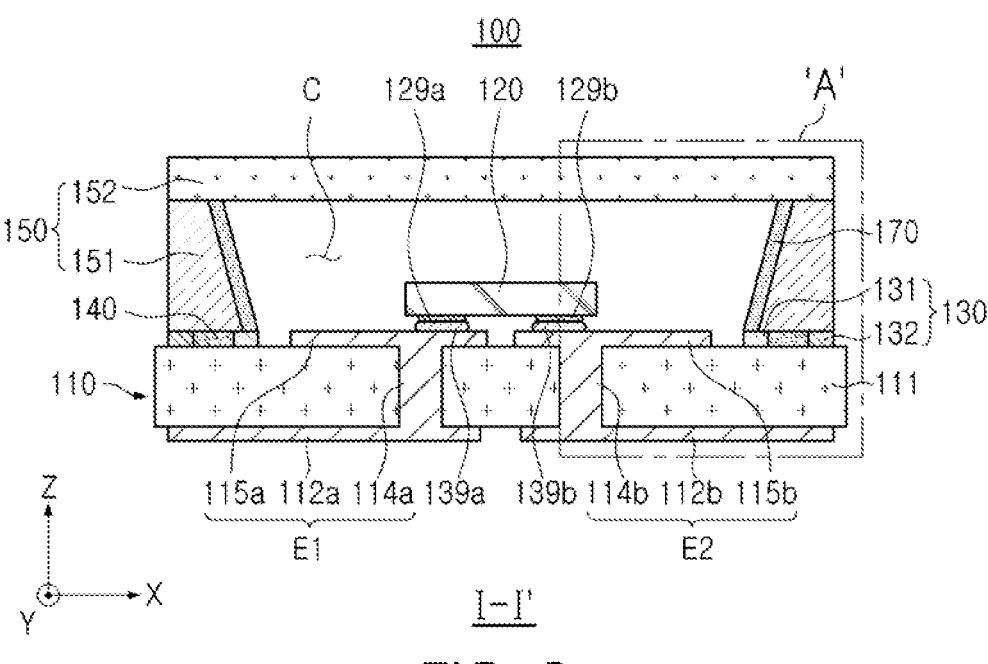
FIG. 2 is a side cross-sectional view of the semiconductor light emitting device package illustrated in FIG. 1 taken along line I-I'.

FIG. 2 is a side cross-sectional view of the semiconductor light emitting device package illustrated in FIG. 1 taken along line I-I'.

Figure 3:
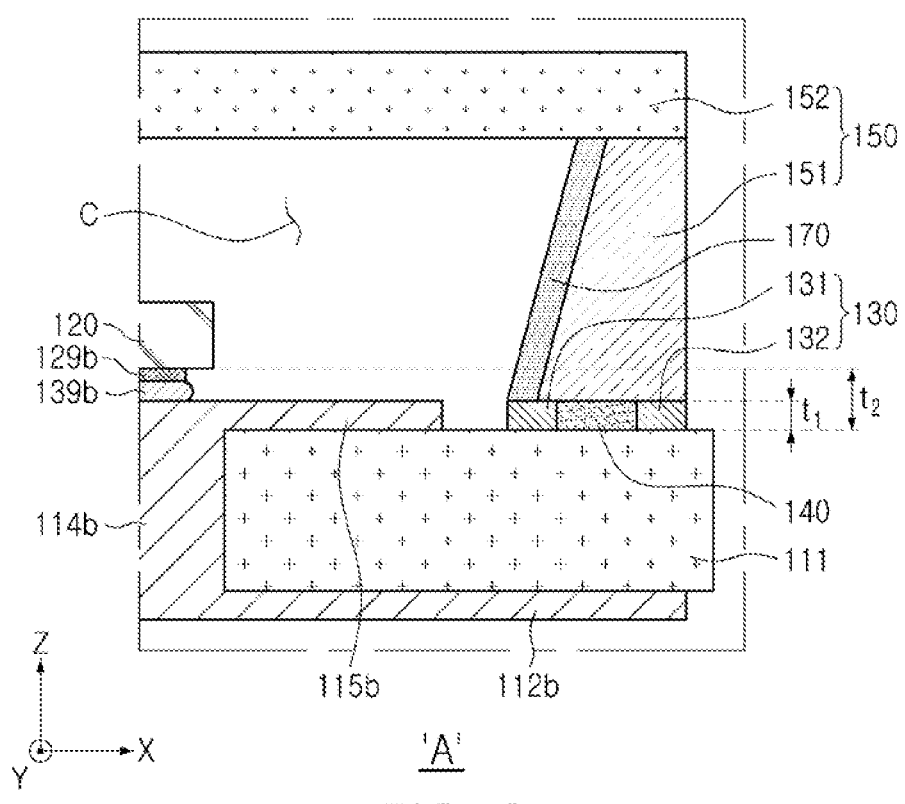
FIG. 3 is an enlarged side cross-sectional view of a region of the semiconductor light emitting device package illustrated in FIG. 2.

FIG. 3 is an enlarged side cross-sectional view of a region of the semiconductor light emitting device package illustrated in FIG. 2.

Referring to FIGS. 1 to 3, a semiconductor light emitting device package 100 may include a circuit board 110 having first and second electrode structures E1 and E2 (e.g., a first electrode structure E1 and a second electrode structure E2), a light emitting diode (LED) chip 120 mounted on the circuit board 110 and electrically connected to the first and second electrode structures E1 and E2, metal patterns 130 disposed on the circuit board 110 to be spaced apart from the first and second electrode structures E1 and E2, an adhesive pattern 140 disposed between adjacent metal patterns of the metal patterns 130, and a protector 150 (e.g., a protection layer) disposed on the circuit board 110 and providing a cavity C surrounding the LED chip 120.

The circuit board 110 may include a plate-shaped ceramic body 111. The ceramic body 111 may include a ceramic material having thermal conductivity of 100 W/m·K or more. For example, the ceramic body 111 may include aluminum nitride, aluminum oxide, or silicon carbide. In some example embodiments, aluminum nitride may be used as the ceramic body 111, and the aluminum nitride may ensure high thermal conductivity of 150 W/m·K or more.

The first and second electrode structures E1 and E2 may include first and second upper pads 115a and 115b disposed on an upper surface of the ceramic body 111, first and second lower pads 112a and 112b disposed on a lower surface of the ceramic body 111, and first and second through vias 114a and 114b penetrating through the ceramic body 111 and respectively connecting the first and second upper pads 115a and 115b and the first and second lower pads 112a and 112b, respectively. For example, the first and second upper pads 115a and 115b, the first and second through electrodes 114a and 114b, and the first and second lower pads 112a and 112b may include a single layer or a multilayer structure of conductive materials such as gold (Au), silver (Ag), copper (Cu), zinc (Zn), aluminum (Al), indium (In), titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), platinum (Pt), or the like.

In some example embodiments, the first and second upper pads 115a and 115b, the first and second through electrodes 114a and 114b, and the first and second lower pads 112a and 112b may be separately manufactured, respectively. In an example embodiment, the first and second upper pads 115a and 115b, the first and second through electrodes 114a and 114b, and the first and second lower pads 112a and 112b may be manufactured at once through a batch process. For example, the first and second electrode structures E1 and E2 may be formed by a plating process using a metal such as copper (Cu). Also, for example, the first and second upper pads 115a and 115b may include a copper (Cu) plating layer and gold/nickel (Au/Ni) or gold/palladium/nickel (Au/Pd/Ni) stacked on the copper (Cu) plating layer.

The LED chip 120 may include first and second electrodes 129a and 129b both disposed on one surface of the LED chip 120 facing an upper surface of the circuit board 110. The first and second electrodes 129a and 129b of the LED chip 120 may be respectively connected to the first and second upper pads 115a and 115b by connection bumps 139a and 139b.

The LED chip 120 may be configured to emit light of a specific wavelength band. In some example embodiments, the LED chip 120 may be configured to emit ultraviolet light in a wavelength range of 100 nm to 400 nm. A structure of such an ultraviolet LED chip will be described later with reference to FIG. 4.

In a specific example, the LED chip 120 may be configured to emit deep ultraviolet (UV-C) light for sterilization and disinfection. Such deep ultraviolet light may have a wavelength range of 200 nm to 280 nm. When such ultraviolet light is irradiated to a resin-based adhesive material such as silicone resin, epoxy resin, or acryl resin, which is mainly used as an adhesive layer, chemical bonding of the above-listed materials are decomposed, such that cracks or discoloration may be induced. Accordingly, there may be restrictions in employing resin-based adhesive materials as an adhesive layer of a semiconductor light emitting device package that emits deep ultraviolet light. However, since the semiconductor light emitting device package 100 according to an example embodiment has a structure in which ultraviolet light is not directly irradiated to the adhesive pattern 140, the adhesive force is not damaged even when the adhesive pattern 140 includes a resin-based adhesive material, and the reliability of the semiconductor light emitting device package 100 may be improved.

The metal patterns 130 (e.g., the plurality of metal patterns) may be disposed on the circuit board 110 to be spaced apart from the first and second electrode structures E1 and E2. The metal patterns 130 may be dummy patterns that are not electrically connected to the LED chip 120. In some example embodiments, the metal patterns 130 may include two or more metal patterns, for example, a first metal pattern 131 and a second metal pattern 132. In an example embodiment, the first and second metal patterns 131 and 132 may be disposed to be spaced apart from each other, and may be disposed to surround the first and second electrode structures E1 and E2 outside the first and second electrode structures E1 and E2. However, the shapes and positions of the first and second metal patterns 131 and 132 are not limited thereto, and may be changed according to the size of the package, required adhesive strength, disposition of electrode structures, and the like. For example, each of the first and second metal patterns 131 and 132 may include a plurality of discontinuous metal lines, or may have a ladder shape connected to each other in at least a portion thereof.

The metal patterns 130 may include at least one of, for example, copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C), but an example embodiment thereof is not limited thereto. In some example embodiments, the metal patterns 130 may include the same metal as the metal layers of the first and second upper pads 115a and 115b.

The adhesive pattern 140 may be disposed between the first and second metal patterns 131 and 132 on the circuit board 110. In some example embodiments, at least one side surface of the adhesive pattern 140 may be in contact with one side surface of the first and second metal patterns 131 and 132. In a specific example embodiment, both side surfaces of the adhesive pattern 140 may be in contact with one side surface of the first and second metal patterns 131 and 132, respectively. In other words, one side surface of the adhesive pattern 140 may contact a side surface of the first metal pattern 131 and another side surface of the adhesive pattern 140 may contact a side surface of the second metal pattern 132.

The adhesive pattern 140 may include a resin-based adhesive material such as a silicone resin, an epoxy resin, or an acrylic resin, a metal layer, water glass, or the like. When the adhesive pattern 140 includes a resin-based adhesive material, the adhesive pattern 140 may be chemically decomposed by ultraviolet light to induce cracks or discoloration. According to an example embodiment of the disclosure, an upper surface of the adhesive pattern 140 may be disposed at the same level as a lower surface of the LED chip 120, or may be disposed on a level lower than that of the lower surface of the LED chip 120. That is, as illustrated in FIG. 3, the distance $t_1$ from the upper surface of the ceramic body 111 to the upper surface of the adhesive pattern 140 may be equal to or less than a distance $t_2$ from the upper surface of ceramic body 111 to the lower surface of LED chip 120. For this reason, since the ultraviolet light emitted from the LED chip 120 is not directly irradiated to the adhesive pattern 140, the adhesive pattern 140 may be protected from the ultraviolet light.

In some example embodiments, a lower surface of the adhesive pattern 140 may be in contact with the ceramic body 111, one side surface of the adhesive pattern 140 may be in contact with one side surface of the metal pattern 131 and another side surface of the adhesive pattern 140 may be in contact with one side surface of the metal pattern 132, and an upper surface of the adhesive pattern 140 may be in contact with a lower surface of the protector 150. That is, the adhesive pattern 140 may be capped (e.g., surrounded) by the ceramic body 111, the metal patterns 131 and 132, and the protector 150. For this reason, since the ultraviolet light emitted from the LED chip 120 is not irradiated to the adhesive pattern 140, damage to the adhesive pattern 140 by the ultraviolet light can be more reliably prevented. Accordingly, the reliability of the semiconductor light emitting device package 100 may be improved.

In some example embodiments, a thickness of the adhesive pattern 140 in a direction (e.g., z-direction) perpendicular to an upper surface of the ceramic body 111 may be in a range of about 5 μm to about 100 μm. When the thickness of the adhesive pattern 140 is less than the above range, the adhesive force between the ceramic body 111 and the protective body 150 may not be sufficient. When the thickness of the adhesive pattern 140 exceeds the above range, it may be disadvantageous to miniaturization of the package or inefficiency in process may be caused. In some example embodiments, the upper surface of the adhesive pattern 140 may be substantially coplanar with the upper surface of the first and second metal patterns 131 and 132.

The protector 150 (e.g., the protection layer) may be disposed on the circuit board 110, and may include a cavity C surrounding the LED chip 120. The protector 150 may be adhered to the circuit board 110, and this adhering may be implemented by the adhesive pattern 140. The cavity C formed by the protector 150 may be provided as a mounting space for the LED chip 120 sealed to prevent penetration of external moisture, or the like.

The protector 150 may include a sidewall structure 151 and a cover 152. The sidewall structure 151 and the cover 152 may include different materials. For example, the sidewall structure 151 may include silicone, and the cover 152 may include high-purity silicon oxide ($SiO_2$). In some example embodiments, the sidewall structure 151 and the cover 152 may be bonded by direct bonding. For example, an upper surface of the sidewall structure 151 and a lower surface of the cover 152 may be bonded by anodic bonding, fusion bonding, plasma activation bonding, or the like. An internal sidewall of the sidewall structure 151 may form an angle of 90° or less with respect to a lower surface of the sidewall structure 151. In some example embodiments, the internal sidewall of the sidewall structure 151 may be inclined with respect to the lower surface thereof, for example, an inclination angle between the internal sidewall of the sidewall structure 151 and the lower surface thereof may be in a range of about 55° to about 75°. Accordingly, light emitted from the LED chip 120 and irradiated to the internal side surface of the sidewall structure 151 may be reflected toward the cover 152, thereby minimizing the light irradiated to the adhesive pattern 140.

The semiconductor light emitting device package 100 may further include a reflective layer 170 disposed on an internal side surface of the sidewall structure 151. The reflective layer 170 may include a material having higher reflectivity than that of the sidewall structure 151. For example, the sidewall structure 151 may be formed of silicon having relatively low reflectivity, and a reflective layer 170 including a material having high reflectivity such as aluminum (Al) or gold (Au) may be disposed on the internal side surface of the sidewall structure 151. Accordingly, light emitted from the LED chip 120 and irradiated to the sidewall structure 151 may be reflected toward the cover 152 by the reflective layer 170. Accordingly, it is possible to more effectively prevent light from being irradiated to the adhesive pattern 140.

In an example embodiment, a protector including at least one of silicon oxide ($SiO_2$), aluminum oxide ($Al_2O_3$), aluminum nitride (AlN), and silicon nitride ($Si_3N_4$) may be additionally provided on a surface of the reflective layer, to prevent the reflective layer 170 from being oxidized.

Figure 4:
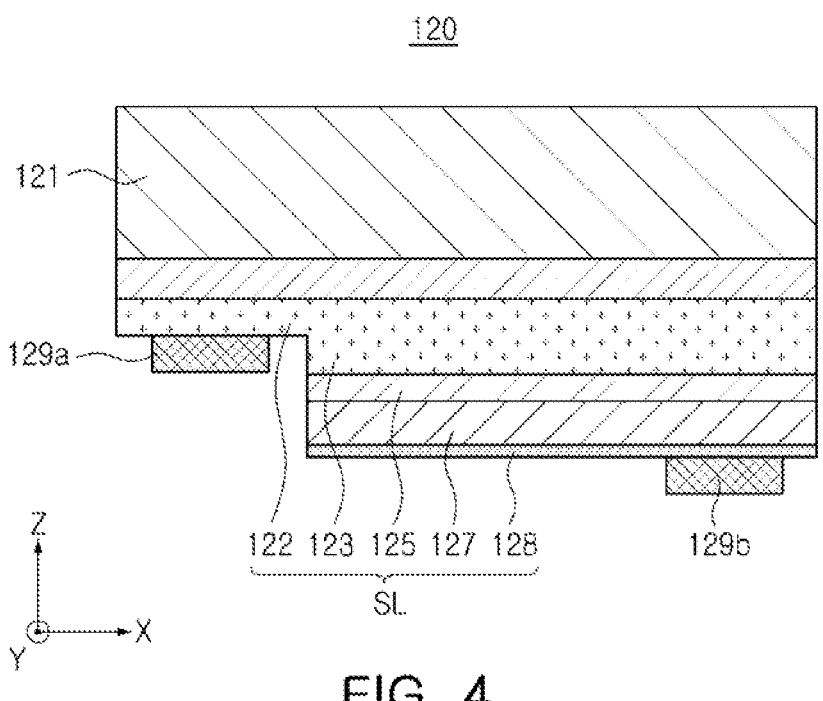
FIG. 4 is a cross-sectional view illustrating an ultraviolet LED employable in a semiconductor light emitting device package according to an embodiment.

FIG. 4 is a cross-sectional view illustrating an ultraviolet LED chip employable in a semiconductor light emitting device package according to an example embodiment of the disclosure.

The ultraviolet LED chip 120 employable in this embodiment includes a substrate 121 and a semiconductor laminate SL disposed on the substrate 121 and configured to emit ultraviolet light. The semiconductor laminate SL includes first and second conductivity-type semiconductor layers 123 and 127, and an active layer 125 disposed between the first and second conductivity-type semiconductor layers 123 and 127.

The substrate 121 is a growth substrate for a semiconductor laminate SL, and may be an insulating, conductive, or semiconductor substrate. For example, the substrate 121 may be made of sapphire, AlN, SiC, $MgAl_2O_4$, MgO, $LiAlO_2$, or $LiGaO_2$. The semiconductor laminate SL employed in an embodiment may include a buffer layer 122 for growing a high-quality AlGaN semiconductor on the substrate 121. For example, the buffer layer 122 may be formed of a nitride such as AlN or AlGaN. The first conductivity-type semiconductor layer 123 may be an n-type nitride semiconductor represented by $Al_{x1}Ga_{1-x1}N$ ($0<x1\leq1$), and the n-type impurity may be Si. For example, the first conductivity-type semiconductor layer 123 may include n-type AlGaN. The second conductivity-type semiconductor layer 127 may be a p-type nitride semiconductor expressed by $Al_{x2}Ga_{1-x2}N$ ($0<x2\leq1$), and the p-type impurity may be Mg.

For example, the second conductivity-type semiconductor layer 127 may include p-type AlGaN. In an example, Al composition ratios (x1 and x2) of the first and second conductivity-type semiconductor layers 123 and 127 may be in a range of 0.45 to 0.99, and further, an Al composition ratio (x1) of the first conductivity-type semiconductor layer 123 may be in a range of 0.60 to 0.65, and Al composition ratios (x1 and x2) of the second conductivity-type semiconductor layer 127 may be in a range of 0.75 to 0.85.

The active layer 125 employed in an example embodiment may have a quantum well formed of $Al_{x3}Ga_{1-x3}N$ ($0<x3<1$). The active layer 125 may be a single-quantum well (SQW) structure having one quantum well, but is not limited thereto, and the active layer 125 may have a multi-quantum well (MQW) structure in which a plurality of quantum well layers formed of $Al_{xa}Ga_{1-xa}N$ ($0<xa<1$) and a plurality of quantum barrier layers formed of $Al_{xb}Ga_{1-xb}N$ ($xa<xb<1$) are alternately stacked.

The quantum well of the active layer 125 has a bandgap determining a wavelength of ultraviolet light, and the active layer 125 employed in this embodiment may be configured to emit light having a wavelength of 100 nm to 400 nm, or a wavelength of 100 nm to 300 nm. The first and second conductivity-type semiconductor layers 123 and 127 may have a bandgap greater than that of the quantum well so that ultraviolet light generated from the active layer 125 is not absorbed. For example, an Al composition ratio (x3 or xa) of the quantum well may be smaller than the Al composition ratios (x1 and x2) of the first and second conductivity-type semiconductor layers 123 and 127. In one example, the Al composition ratio (x3 or xa) of the quantum well may be in a range of 0.4 to 1.00, and the Al composition ratio may be adjusted according to a desired wavelength.

When the second conductivity-type semiconductor layer 127 is formed of p-type AlGaN, since it is difficult to form an ohmic contact with a common electrode material, the semiconductor laminate SL employed in an embodiment may include a second conductivity-type contact layer 128 formed on the second conductive type semiconductor layer 127 and having a relatively low bandgap. An Al composition ratio of the second conductivity-type contact layer 128 may be smaller than the Al composition ratio (x2) of the second conductivity-type semiconductor layer 127, and may include, for example, p-type GaN.

The ultraviolet LED chip 120 according to an embodiment includes first and second electrodes 129a and 129b respectively connected to the first and second conductivity-type semiconductor layers 123 and 127. The semiconductor laminate SL has a region in which the second conductivity-type semiconductor layer 127 and the active layer 125 are partially removed to expose a region of the first conductivity-type semiconductor layer 123. The first electrode 129a may be disposed on the exposed region of the first conductivity-type semiconductor layer 123. For example, the first and second electrodes 129a and 129b may have a multilayer structure formed of Al, Ti, Ni, Cr, Au, Ag, ITO, or a combination thereof. For example, the first electrode 129a may include Ti/Al/Ni/Au, and the second electrode 129b may include Ag or Ni/Au.

In addition to the ultraviolet LED chip illustrated in FIG. 4, LED chips having various structures may be used. For example, the ultraviolet LED chip or device described in Korean Patent Application 10-2017-0175149 (Application Date: 2017 Dec. 19, Applicant: Samsung Electronics Co., Ltd., U.S. Pat. No. 10,333,025 B1), Korean Patent Application 10-2017-0175150 (Application Date: 2017 Dec. 19, Applicant: Samsung Electronics Co., Ltd.), U.S. Pat. No. 10,483,433 B2), and Korean Patent Application No. 10-2017-0171131 (application date: Dec. 13, 2017, applicant: Samsung Electronics Co., Ltd., U.S. Pat. No. 10,862, 004 B2) may be used as the semiconductor light emitting device according to this embodiment.

Figure 5:
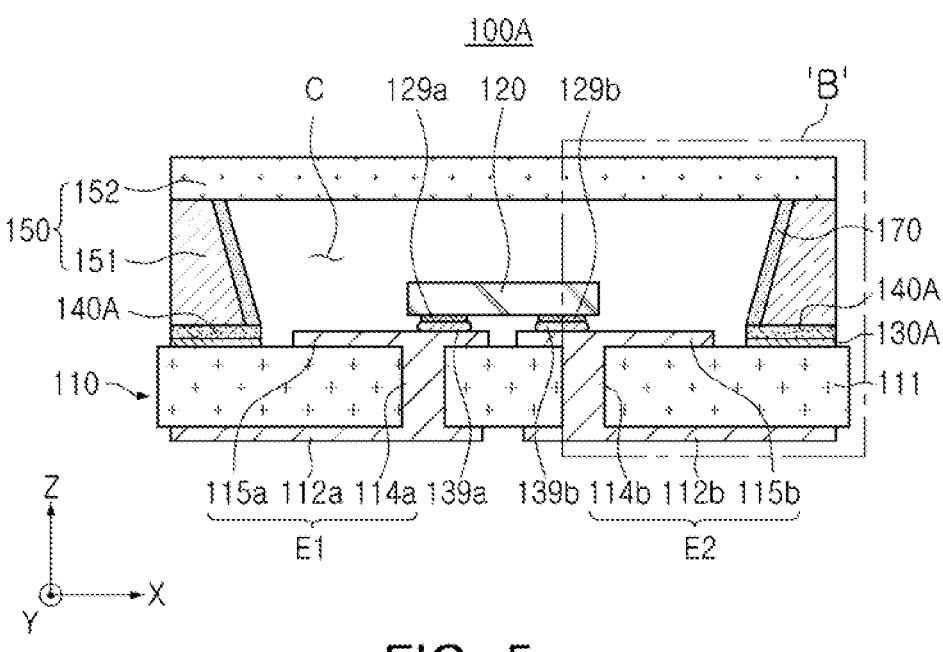
FIG. 5 is a side cross-sectional view of a semiconductor light emitting device package according to an embodiment.
Figures 6A, 6B:
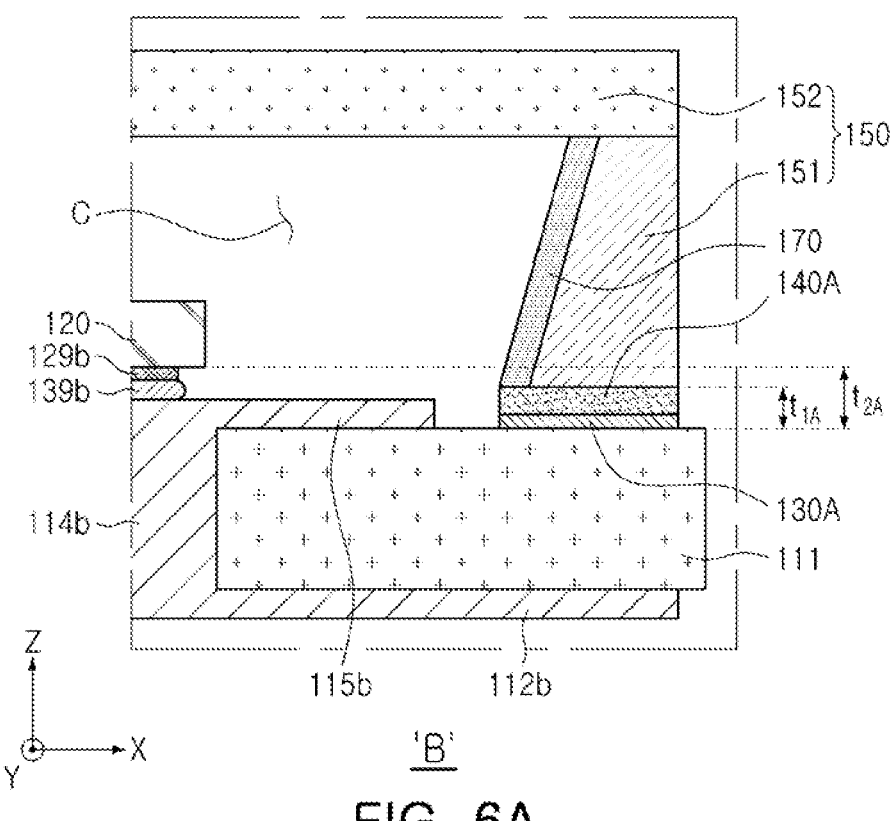
FIGS. 6A and 6B are enlarged cross-sectional views of a region of a semiconductor light emitting device package.

FIG. 5 is a perspective view of a semiconductor light emitting device package according to an example embodiment of the disclosure, and FIG. 6A is an enlarged cross-sectional view of region "B" of the semiconductor light emitting device package illustrated in FIG. 5. FIG. 6B is an enlarged cross-sectional view of a region of a semiconductor light emitting device package according to an example embodiment.

Referring to FIGS. 5, 6A and 6B, it can be understood that a semiconductor light emitting device package 100A according to an embodiment is similar to the semiconductor light emitting device package 100 illustrated in FIGS. 1 to 3, except that the shapes and positions of the metal pattern 130A and the adhesive pattern 140A are different. The description of the components of the present embodiment may refer to the description of the same or similar components of the semiconductor light emitting device package 100 illustrated in FIGS. 1 to 3 unless otherwise specifically stated.

In an example embodiment, the metal pattern 130A may include a single metal layer, and the adhesive pattern 140A may be disposed to overlap the metal pattern 130A on an upper surface of the metal pattern 130A. The adhesive pattern 140A employed in this embodiment is different from the example embodiments illustrated in FIGS. 1 to 3 in that it is not capped (e.g., surrounded) by neighboring components.

In the example embodiments illustrated in FIGS. 5 and 6A, the upper surface of the metal pattern 130A may be disposed on a level below upper surfaces of the first and second upper pads 115a and 115b. The upper surface of the adhesive pattern 140A may be disposed on a level below that of a lower surface of the LED chip 120. That is, a distance ($t_{1A}$ in FIG. 6A) from the upper surface of the ceramic body 111 to the upper surface of the adhesive pattern 140A may be less than or equal to a distance ($t_{2A}$ in FIG. 6A) from the upper surface of the ceramic body 111 to the lower surface of the LED chip 120. By controlling the shapes and positions of the metal pattern 130A and the adhesive pattern 140A in this manner, it is possible to prevent the ultraviolet light emitted from the LED chip 120 from being irradiated to the adhesive pattern 140A. Since the adhesive pattern 140A is protected from ultraviolet light, the reliability of the semiconductor light emitting device package 100A may be improved.

In an example embodiment, as illustrated FIG. 6B, an upper surface of the metal pattern 130A' may be disposed at the same level as upper surfaces of the first and second upper pads 115a and 115b. The upper surface of the adhesive pattern 140A' may be disposed on a level below the lower surface of the LED chip 120 or on a level between the upper and lower surfaces of the LED chip 120. In other words, the lower surface of the LED chip 120 may be disposed at a first height and the upper surface of the adhesive pattern 140A' may be disposed at a second height greater than or equal to the first height. When the upper surface of the adhesive pattern 140A' is disposed on a level between the upper surface and the lower surface of the LED chip 120, the upper surface of the adhesive pattern 140A' may be disposed on a level below the middle of the upper surface and the lower surface of the LED chip 120. For example, a distance (t) between the lower surface of the LED chip 120 and the upper surface of the adhesive pattern 140A' may be about 150 μm or less. When the distance (t) between the lower surface of the LED chip 120 and the upper surface of the adhesive pattern 140A' is within the above range, while securing the adhesive force between the ceramic body 111 and the protector 150, it is possible to prevent the ultraviolet light emitted from the LED chip 120 from being directly irradiated to the adhesive pattern 140A'.

In an example embodiment, the metal pattern 130A and the adhesive pattern 140A are illustrated as having the same width in an x direction, but the disclosure is not limited thereto. In some example embodiments, a width of the metal pattern 130A in the x direction and a width of the adhesive pattern 140A in the x direction may be different, for example, the width of the adhesive pattern 140A in the x direction may be smaller than the width of the metal pattern 130A in the x direction.

Figure 7:
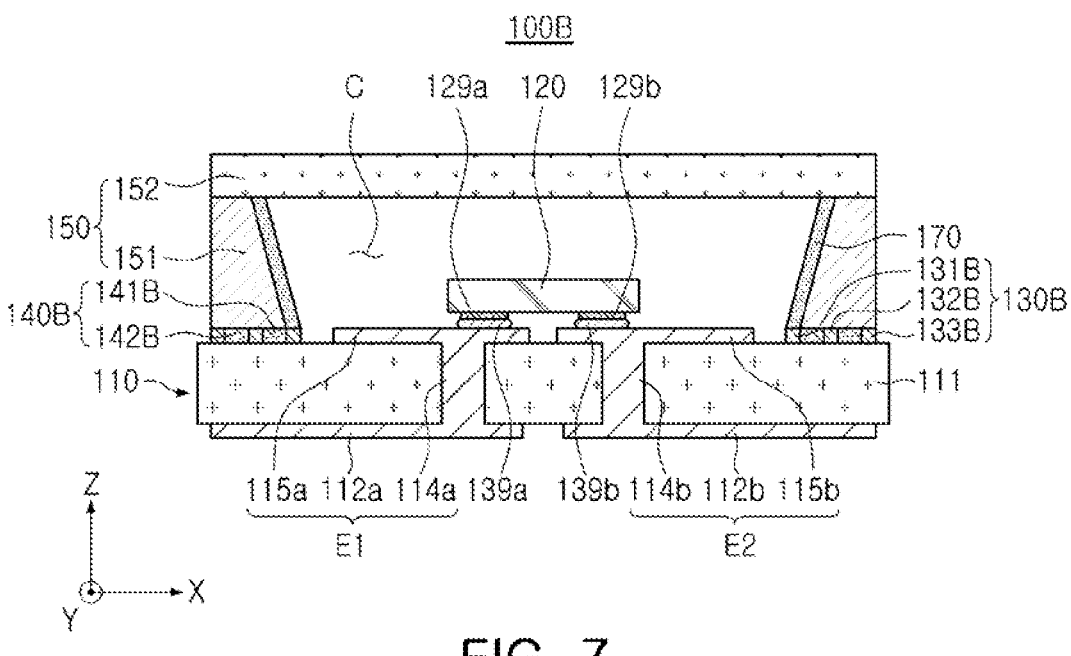
FIG. 7 is a side cross-sectional view of a semiconductor light emitting device package according to an embodiment.

FIG. 7 is a side cross-sectional view of a semiconductor light emitting device package according to an example embodiment of the present disclosure.

Referring to FIG. 7, it can be understood that a semiconductor light emitting device package 100B according to an embodiment is similar to the semiconductor light emitting device package 100 illustrated in FIGS. 1 to 3, except that the number of metal patterns 130B and adhesive patterns 140B is different. The description of the components of the present embodiment may refer to the description of the same or similar components of the semiconductor light emitting device package 100 illustrated in FIGS. 1 to 3 unless otherwise specifically stated.

The metal patterns 130B employed in an embodiment may include first to third metal patterns 131B, 132B, and 133B, and the adhesive patterns 140B may include first and second adhesive patterns 141B and 142B. In an embodiment, the first adhesive pattern 141B may be disposed between the first and second metal patterns 131B and 132B so that both side surfaces thereof are in contact with side surfaces of the first and second metal patterns 131B and 132B. The second adhesive pattern 142B may be disposed between the second and third metal patterns 132B and 133B so that both side surfaces thereof contact side surfaces of the second and third metal patterns 132B and 133B.

In this embodiment, the first and second adhesive patterns 141B and 142B may include an adhesive material such as silicone, epoxy, or acrylic. Such a resin-based adhesive layer may release stress due to mismatching of thermal expansion coefficients due to elastic modulus. In addition, the second metal pattern 132B disposed between the first and second adhesive patterns 141B and 142B may serve as a reinforcing material to improve structural stability of the semiconductor light emitting device package 100B. That is, according to an embodiment, there is an advantage in that the structural stability of the package can be improved by reducing warpage while maintaining the adhesive force of the protective layer 150 to improve reliability.

Figure 8:
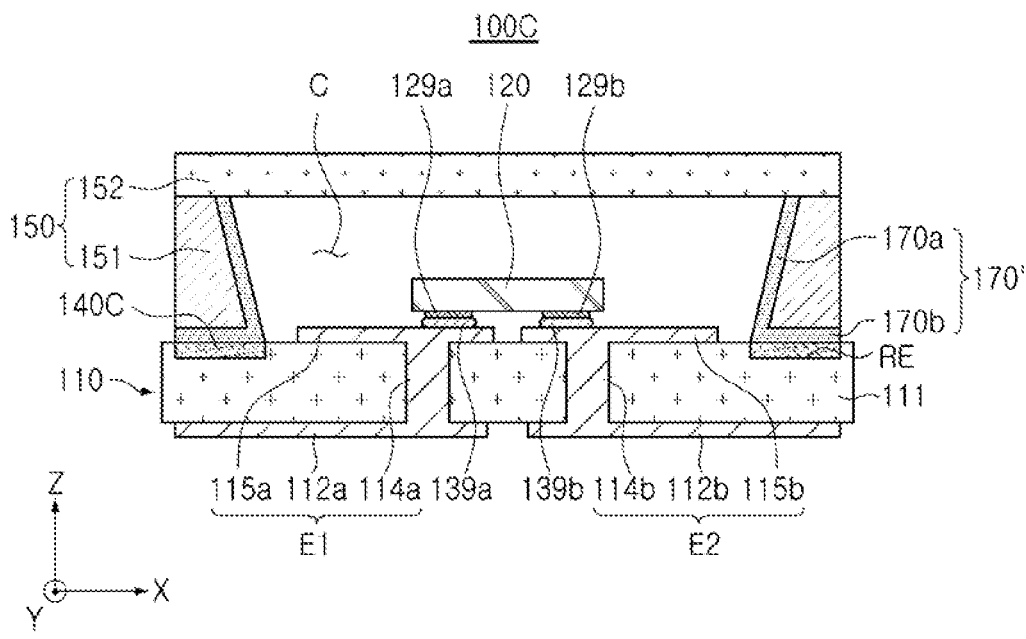
FIG. 8 is a side cross-sectional view of a semiconductor light emitting device package according to according to an embodiment.

FIG. 8 is a side cross-sectional view of a semiconductor light emitting device package according to an example embodiment of the disclosure.

Referring to FIG. 8, it can be understood that a semiconductor light emitting device package 100C according to an embodiment is similar to the semiconductor light emitting device package 100 illustrated in FIGS. 1 to 3, except that the metal patterns 130 are not included and a shape of a reflective layer 170' is different. The description of the components of the present embodiment may refer to the description of the same or similar components of the semiconductor light emitting device package 100 illustrated in FIGS. 1 to 3 unless otherwise specifically stated.

An adhesive pattern 140C employed in an embodiment may be disposed in a recess portion RE formed in the ceramic body 111. Accordingly, a distance between an upper surface of the adhesive pattern 140C and the LED chip 120 may be sufficiently secured. The upper surface of the adhesive pattern 140C may be substantially coplanar with the upper surface of the ceramic body 111. A thickness of the recess portion RE in a z-direction may be in a range of about 20% to about 80% of a thickness of the ceramic body 111 in the z-direction. When the thickness of the recess portion RE in the z-direction is less than the above range, the adhesive force by the adhesive pattern 140C may not be sufficiently secured. When the thickness of the recess portion RE in the z direction exceeds the above range, the ceramic body 111 may become brittle.

The reflective layer 170' according to an embodiment may include a first portion 170a disposed on an internal side surface of the sidewall structure 151 and a second portion 170b disposed on a lower surface of the sidewall structure 151. The first and second portions 170a and 170b may include a material having high reflectivity such as aluminum (Al) or gold (Au), and the second portion 170b may be integrally formed to extend from the first portion 170a. The adhesive pattern 140C may be separated from the sidewall structure 151 by the first and second portions 170a and 170b of the reflective layer 170'. Even when a portion of the ultraviolet light emitted from the LED chip 120 is reflected by the internal surfaces of the cover 152 and the sidewall structure 151 and reaches the lower surface of the sidewall structure 151, since the second portion 170b reflects UV light on the adhesive pattern 140C, it is possible to prevent the UV light from being irradiated to the adhesive pattern 140C. Accordingly, damage to the adhesive pattern 140C may be prevented, and reliability of the semiconductor light emitting device package 100C may be improved. The structure and shape of the reflective layer 170' is not limited to this embodiment, and may be applied to other embodiments in the same or similar manner.

Figure 9:
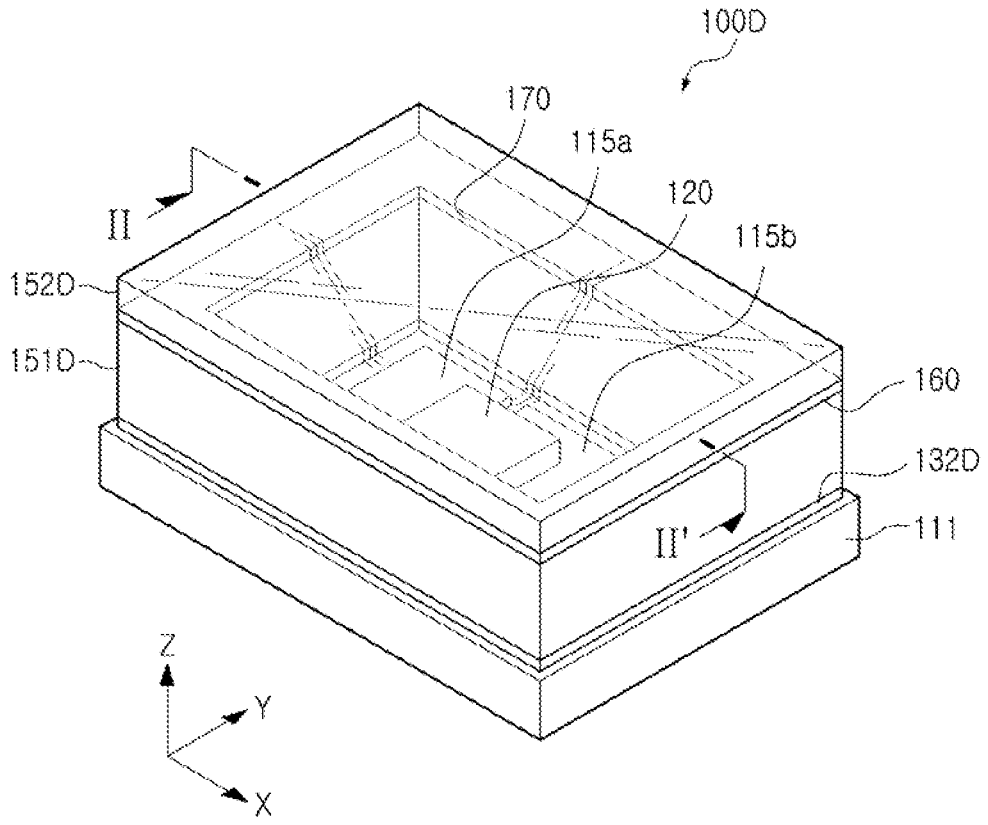
FIG. 9 is a perspective view of a semiconductor light emitting device package according to an embodiment.

FIG. 9 is a perspective view of a semiconductor light emitting device package according to an example embodiment of the disclosure.

Figure 10:
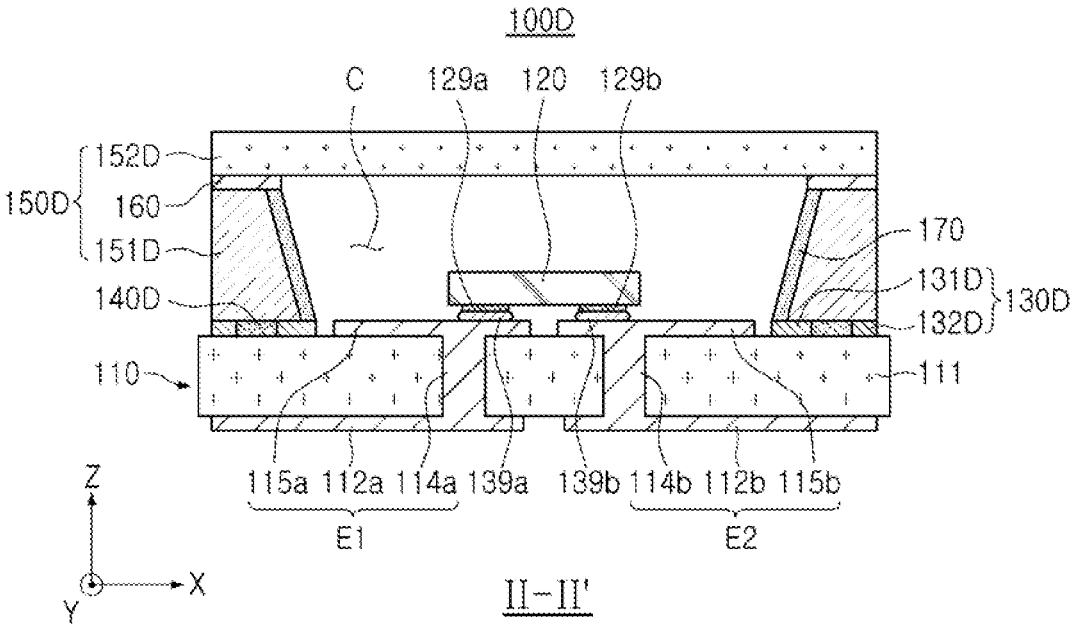
FIG. 10 is a side cross-sectional view of a semiconductor light emitting device package according to an embodiment.

FIG. 10 is a side cross-sectional view of a semiconductor light emitting device package according to an example embodiment of the disclosure.

Referring to FIGS. 9 and 10, it can be understood that a semiconductor light emitting device package 100D according to an embodiment is similar to the semiconductor light emitting device package 100 illustrated in FIGS. 1 to 3, except that a sidewall structure 151D and a cover 152D constituting a protector 150D are adhered to each other by a second adhesive pattern 160. The description of the components of the present embodiment may refer to the description of the same or similar components of the semiconductor light emitting device package 100 illustrated in FIGS. 1 to 3 unless otherwise specifically stated.

The protector 150D employed in this embodiment may be formed by adhering the sidewall structure 151D and the cover 152D by the second adhesive pattern 160. For example, the second adhesive pattern 160 may be interposed between an upper surface of the sidewall structure 151D and a lower surface of the cover 152D. The second adhesive pattern 160 may include a resin-based adhesive material such as silicone, epoxy, or acrylic. However, when an LED chip for ultraviolet light is used as the LED chip 120, glass frit or solder may be used.

FIGS. 11 to 14 are plan views for each process for illustrating a method of manufacturing a semiconductor light emitting device package according to an example embodiment of the disclosure.

Figure 11:
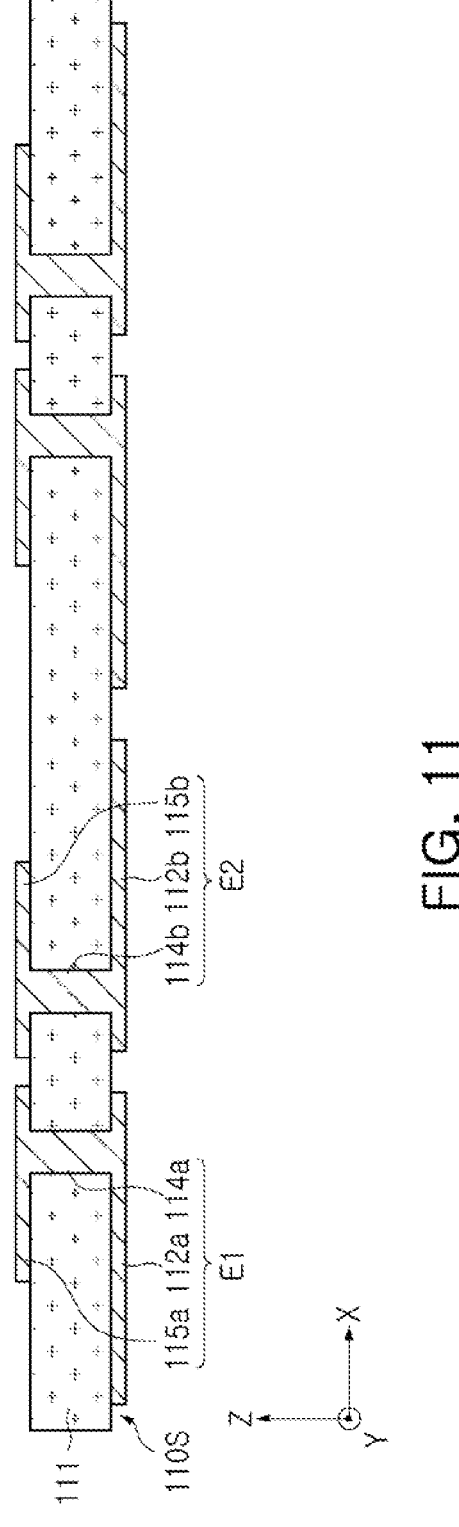
FIGS. 11 to 14 are plan views for each process for illustrating a method of manufacturing a semiconductor light emitting device package according to an embodiment.

Referring to FIG. 11, a base substrate 110S having a plurality of circuit boards 110 illustrated in FIG. 2 is provided.

The base substrate 110S may include a ceramic body 111. For example, the ceramic body 111 may include aluminum nitride, aluminum oxide, or silicon carbide. In some example embodiments, the ceramic body 111 may include aluminum nitride having excellent heat dissipation performance.

First and second electrode structures E1 and E2 may be formed in each circuit board region. The first and second electrode structures E1 and E2 may include first and second upper pads 115a and 115b respectively disposed on an upper surface of the ceramic body 111, first and second lower pads 112a and 112b disposed on a lower surface of the ceramic body 111, and first and second through electrodes 114a and 114b penetrating through the ceramic body 111 and respectively connecting the first and second upper pads 115a and 115b to the first and second lower pads 112a and 112b. The first and second electrode structures have may include a single-layer or multi-layer structure of a conductive material such as gold (Au), silver (Ag), copper (Cu), zinc (Zn), aluminum (Al), indium (In), titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), or platinum (Pt). The first and second electrode structures E1 and E2 may be formed by a plating process using a metal such as copper (Cu).

Figure 12:
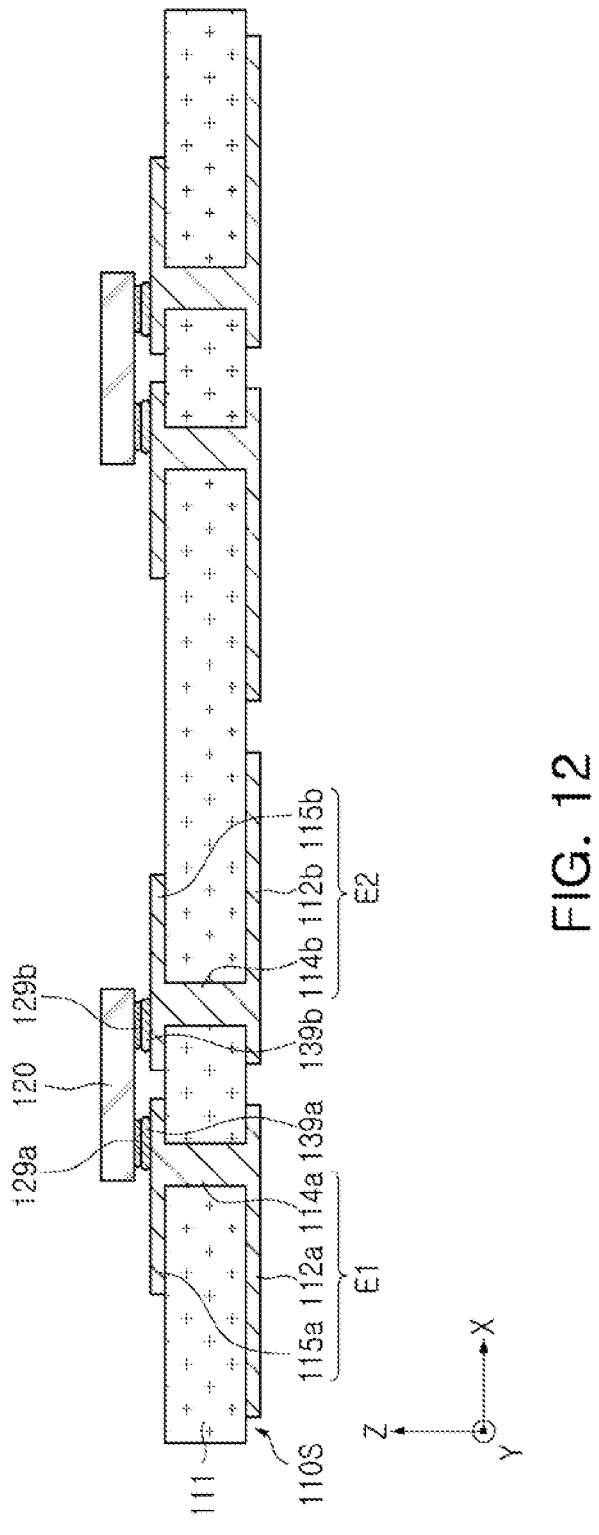

Referring to FIG. 12, a plurality of LED chips 120 are mounted on the base substrate 110S, respectively.

The plurality of LED chips 120 may be mounted on the base substrate 110S so that first and second electrodes 129a and 129b of the LED chip 120 are respectively connected to the first and second upper pads 115a and 115b using connection bumps 139a and 139b. In an example embodiment, it is illustrated in a form in which it is connected in a flip-chip bonding method, but a flip-chip may be directly bonded without the connection bumps 139a and 139b (e.g., eutectic bonding method). A flux may be used for such eutectic bonding. In an example embodiment, the LED chip may be bonded using a wire.

Figure 13:
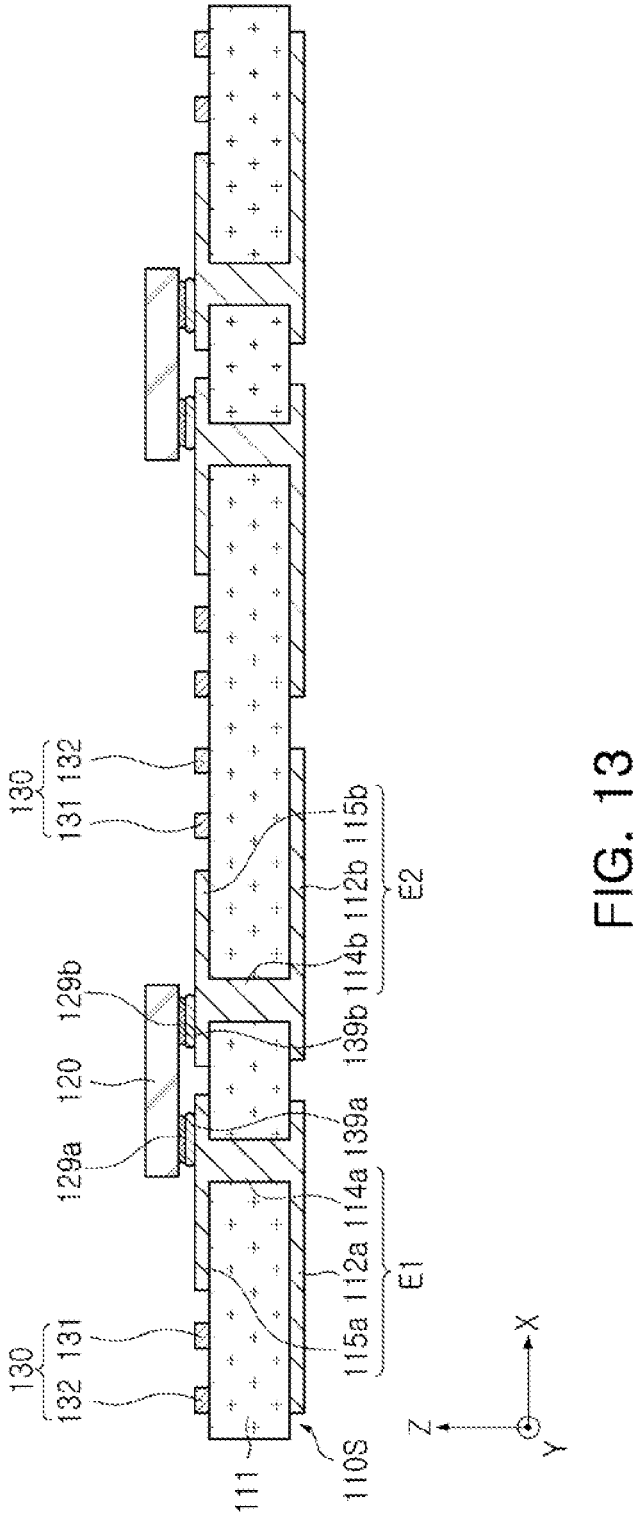

Referring to FIG. 13, metal patterns 130 may be formed on the base substrate 110S.

In an example embodiment, the metal patterns 130 may include a first metal pattern 131 and a second metal pattern 132. The first and second metal patterns 131 and 132 may be formed to be spaced apart from the first and second electrode structures E1 and E2 and the LED chip 120. The first and second metal patterns 131 and 132 may be dummy patterns. The first and second metal patterns 131 and 132 may include the same or different materials from those of the first and second electrode structures E1 and E2. For example, the first and second metal patterns 131 and 132 may include a conductive material such as gold (Au), silver (Ag), copper (Cu), zinc (Zn), aluminum (Al), indium (In), or titanium (Ti), silicon (Si), germanium (Ge), tin (Sn), magnesium (Mg), tantalum (Ta), chromium (Cr), tungsten (W), ruthenium (Ru), rhodium (Rh), iridium (Ir), nickel (Ni), palladium (Pd), or platinum (Pt), but an example embodiment thereof is not limited thereto.

The first and second metal patterns 131 and 132 may be formed to be spaced apart from each other. However, in some example embodiments, the first metal pattern 131 may be connected to the second metal pattern 132 in at least a portion thereof. For example, the metal patterns 130 may further include a cross-linking portion connecting the first metal pattern 131 to the second metal pattern 132. A distance between the first and second metal patterns 131 and 132 may be greater than or equal to a width of the first and second metal patterns 131 and 132 in an x direction, but an example embodiment thereof is not limited thereto. The distance between the first and second metal patterns 131 and 132 may be controlled differently depending on a material of the adhesive pattern, a size of the protector, a type of the substrate, and the like.

The first and second metal patterns 131 and 132 may be formed to have a thickness of about 5 μm to about 100 μm. For example, the first and second metal patterns 131 and 132 may be formed to have a thickness of about 25 μm to about 35 μm. Upper surfaces of the first and second metal patterns 131 and 132 may be disposed at the same level as a lower surface of the LED chip 120 or lower than the lower surface of the LED chip 120.

An order of a process of bonding the LED chip 120 (FIG. 12) and a process of forming the first and second metal patterns 131 and 132 (FIG. 13) may be changed. For example, it is also possible to first form the first and second metal patterns 131 and 132, and then bond the LED chip 120 on the base substrate 110S.

Figure 14:
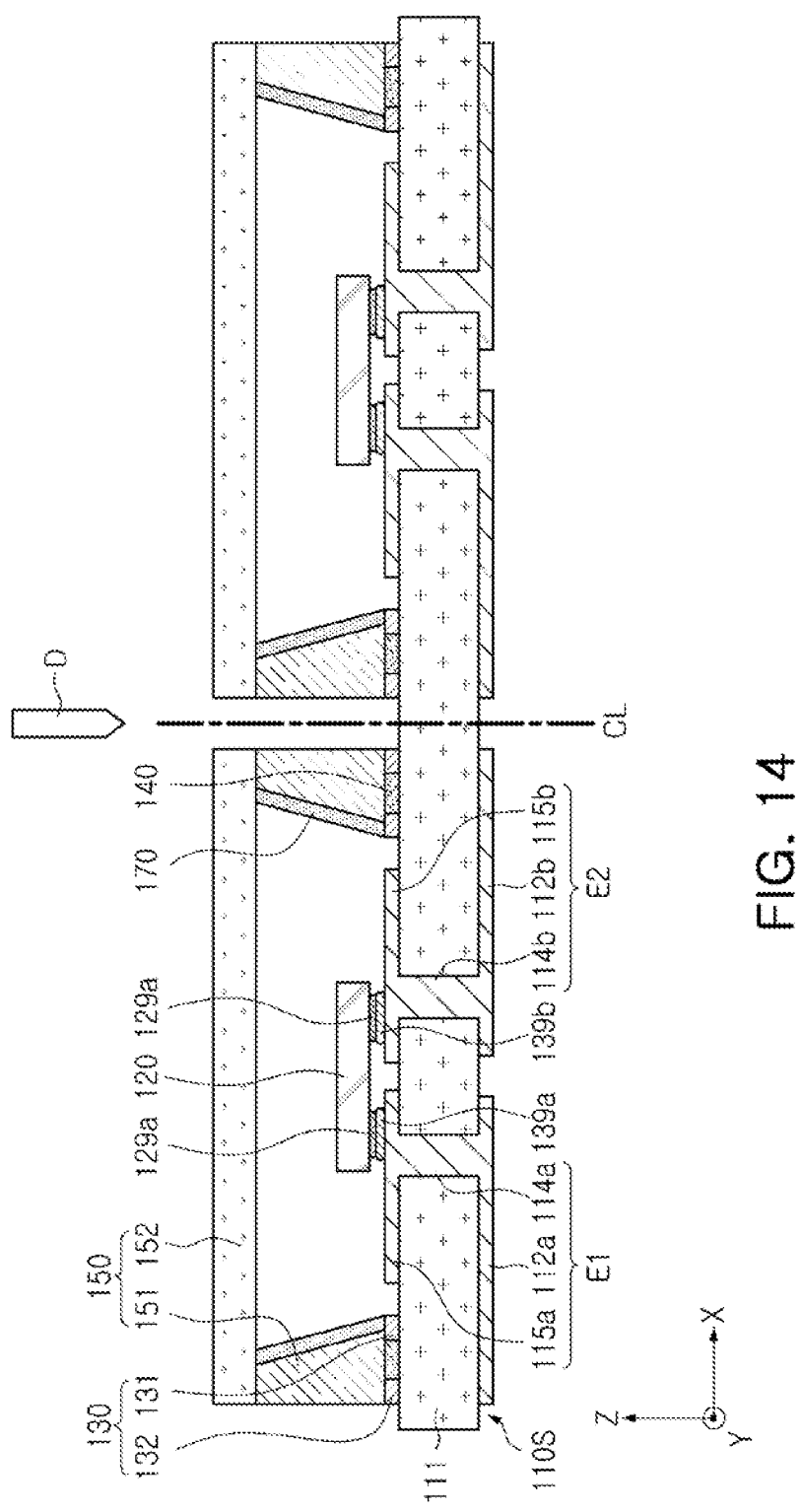

Referring to FIG. 14, an adhesive pattern 140 may be formed between the first and second metal patterns 131 and 132.

The adhesive pattern 140 employed in this embodiment may be formed so that the side surfaces of the adhesive pattern 140 are in contact with side surfaces of the first and second metal patterns 131 and 132, respectively. Also, an upper surface of the adhesive pattern 140 may be formed to be substantially coplanar with upper surfaces of the first and second metal patterns 131 and 132. The upper surface of the adhesive pattern 140 may be disposed at the same level as the lower surface of the LED chip 120 or lower than the lower surface of the LED chip 120. For this reason, since light emitted from the LED chip 120 is not irradiated to the adhesive pattern 140, even when a resin-based adhesive material is used as the adhesive pattern 140, reliability of the package is improved by maintaining the adhesive force.

The protector 150 may be adhered to the base substrate 110S by the adhesive pattern 140. The protector 150 may be formed by bonding a cover 152 to an upper portion of the sidewall structure 151. A reflective layer 170 including aluminum (Al), gold (Au), or the like may be disposed on an internal side surface of the sidewall structure 151. In an embodiment, the protector 150 is disposed to cover all of the upper surfaces of the first and second metal patterns 131 and 132, but an example embodiment of the disclosure is not limited thereto. For example, the protector 150 may be disposed to cover at least a portion of the upper surfaces of the first and second metal patterns 131 and 132.

The adhesive pattern 140 may be capped (e.g., surrounded) by an upper surface of the base substrate 110S, side surfaces of the first and second metal patterns 131 and 132, and a lower surface of the protector 150. Accordingly, the adhesive pattern 140 may be more effectively sealed from the light emitted from the LED chip 120, thereby preventing the adhesive pattern 140 from being decomposed or damaged.

Next, when the semiconductor ultraviolet light emitting device of individual device units is cut along a cutting line CL using a saw D, the semiconductor light emitting device package 100 illustrated in FIG. 2 may be manufactured.

As set forth above, according to the disclosure, a semiconductor light emitting device package having a highly reliable structure may be provided by designing a structure of the package so that light emitted from a light emitting diode chip is not irradiated to an adhesive pattern interposed between a substrate on which the light emitting diode chip is mounted and a protector providing a cavity (mounting space) surrounding the light emitting diode chip.

Various advantages and effects of the disclosure are not limited to the above description, and it will be more readily understood in the process of describing the specific embodiments of the disclosure.

While the example embodiments have been shown and described above, it will be apparent to those skilled in the art that modifications and variations could be made without departing from the scope of the disclosure as defined by the appended claims.

What is claimed is:

1. A semiconductor light emitting device package, comprising:
   a ceramic substrate comprising a first electrode structure and a second electrode structure;
   a light emitting diode chip mounted on the ceramic substrate, wherein the light emitting diode chip is electrically connected to the first electrode structure and to the second electrode structure and is configured to emit ultraviolet light;
   a plurality of metal patterns disposed on the ceramic substrate spaced apart from the first electrode structure and from the second electrode structure;
   an adhesive pattern disposed on the ceramic substrate between adjacent metal patterns from among the plurality of metal patterns, wherein one side surface of the adhesive pattern contacts a side surface of one of the adjacent metal patterns, another side surface of the adhesive pattern contacts a side surface of the other of the adjacent metal patterns, and an upper surface of the adhesive pattern is positioned on a level below a level of a lower surface of the light emitting diode chip; and
   a protection layer attached to the ceramic substrate by the adhesive pattern, the protection layer providing a cavity surrounding the light emitting diode chip,
   wherein the upper surface of the adhesive pattern is substantially coplanar with upper surfaces of the adjacent metal patterns.

2. The semiconductor light emitting device package of claim 1, wherein the adhesive pattern comprises at least one of a silicone resin, an epoxy resin, and an acrylic resin.

3. The semiconductor light emitting device package of claim 1, wherein the adhesive pattern is surrounded by the plurality of metal patterns, the protection layer, and the ceramic substrate.

4. The semiconductor light emitting device package of claim 1, wherein a thickness of the adhesive pattern in a direction perpendicular to an upper surface of the ceramic substrate is about 5 μm to about 100 μm.

5. The semiconductor light emitting device package of claim 1, wherein each of the plurality of metal patterns comprises at least one of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C).

6. The semiconductor light emitting device package of claim 1, wherein the ultraviolet light emitted from the light emitting diode chip has a wavelength range of about 200 to about 280 nm.

7. The semiconductor light emitting device package of claim 1, wherein the ceramic substrate comprises at least one of aluminum nitride, aluminum oxide, and silicon carbide.

8. The semiconductor light emitting device package of claim 1, wherein the protection layer comprises an internal side surface defining the cavity, and
   wherein the protection layer further comprises a reflective layer disposed on the internal side surface.

9. The semiconductor light emitting device package of claim 8, wherein the reflective layer comprises a material having higher reflectivity than a reflectivity of the protection layer.

10. The semiconductor light emitting device package of claim 8, wherein the reflective layer comprises at least one of aluminum (Al) and gold (Au).

11. A semiconductor light emitting device package, comprising:
   a circuit board comprising a ceramic body, a first electrode structure, and a second electrode structure, both of the first electrode structure and the second electrode structure penetrating the ceramic body;
   a light emitting diode chip mounted on the circuit board, wherein the light emitting diode chip is electrically connected to the first electrode structure and to the second electrode structure and is configured to emit ultraviolet light;
   a plurality of metal patterns disposed on the circuit board spaced apart from the first electrode structure and the second electrode structure;
   a first adhesive pattern disposed on the circuit board between and contacting adjacent metal patterns from among the plurality of metal patterns;
   a sidewall structure adhered to the circuit board by the first adhesive pattern, the sidewall structure providing a cavity surrounding the light emitting diode chip; and
   a cover disposed on the sidewall structure to seal the cavity,
   wherein the first adhesive pattern is surrounded by the plurality of metal patterns, the sidewall structure, and the ceramic body,
   wherein the sidewall structure comprises an internal side surface defining the cavity, and
   wherein the internal side surface has an inclination angle of about 55° to about 75° with respect to a lower surface of the sidewall structure.

12. The semiconductor light emitting device package of claim 11, further comprising a second adhesive pattern interposed between the sidewall structure and the cover, wherein the second adhesive pattern comprises solder or glass frit.

13. The semiconductor light emitting device package of claim 11, wherein the light emitting diode chip is configured to emit the ultraviolet light in a wavelength range of about 260 nm to about 280 nm.

14. A semiconductor light emitting device package, comprising:

a circuit board;

a light emitting diode chip mounted on an upper surface of the circuit board;

a protection layer disposed on the upper surface of the circuit board, the protection layer providing a cavity surrounding the light emitting diode chip; and a dummy pattern and an adhesive pattern interposed between the upper surface of the circuit board and a lower surface of the protection layer, wherein the lower surface of the protection layer is positioned on a level below a level of a lower surface of the light emitting diode chip, wherein one side surface of the adhesive pattern contacts one side surface of the dummy pattern and another side surface of the adhesive pattern contacts a side surface of a second dummy pattern adjacent to the dummy pattern, and wherein an upper surface of the adhesive pattern is disposed at substantially a same level as an upper surface of the dummy pattern.

15. The semiconductor light emitting device package of claim 14, wherein the adhesive pattern is disposed on the upper surface of the dummy pattern to overlap the dummy pattern, and wherein the upper surface of the dummy pattern and the upper surface of the adhesive pattern are disposed on a level below the level of the lower surface of the light emitting diode chip.

16. The semiconductor light emitting device package of claim 14, wherein the lower surface of the light emitting diode chip is disposed at a first height, wherein the upper surface of the adhesive pattern is disposed at a second height greater than or equal to the first height, and wherein a difference between the first height and the second height is about 0 or more and about 150 μm or less.

17. The semiconductor light emitting device package of claim 14, wherein the dummy pattern comprises copper (Cu), and wherein a thickness of the dummy pattern in a direction perpendicular to the upper surface of the circuit board is about 25 μm to about 45 μm.

* * * * *